United States Patent [19]
Yamazaki

[11] Patent Number: 5,608,695
[45] Date of Patent: Mar. 4, 1997

[54] OPTICAL PICK-UP APPARATUS WITH TRACKING ERROR DETECTION BY DETECTION OF AMOUNT OF LIGHT IN FAN FIELD

[75] Inventor: Takeshi Yamazaki, Hachioji, Japan

[73] Assignee: Olympus Optical Co., Ltd., Tokyo, Japan

[21] Appl. No.: 337,190

[22] Filed: Nov. 7, 1994

[30] Foreign Application Priority Data

Nov. 8, 1993 [JP] Japan .................................. 5-278286

[51] Int. Cl.⁶ ............................................... G11B 7/09
[52] U.S. Cl. ............................ 369/44.12; 369/44.14; 369/103; 369/112; 369/44.23
[58] Field of Search ............................ 369/44.23, 44.37, 369/44.41, 44.14, 103, 109, 112, 44.12; 250/201.5

[56] References Cited

U.S. PATENT DOCUMENTS

| | | | |
|---|---|---|---|
| 4,945,529 | 7/1990 | Ono et al. | 369/109 |
| 5,231,620 | 7/1993 | Ohuchida | 369/44.37 X |
| 5,391,865 | 2/1995 | Kurata et al. | 250/201.5 |

FOREIGN PATENT DOCUMENTS

| | | |
|---|---|---|
| 4248134A | 9/1992 | Japan . |
| 5307759A | 11/1993 | Japan . |

*Primary Examiner*—Thang V. Tran
*Attorney, Agent, or Firm*—Watson Cole Stevens Davis, P.L.L.C.

[57] ABSTRACT

An optical pick-up apparatus for reading and/or writing information from and/or on an optical record medium including a semiconductor laser, an objective lens projecting a laser beam onto the optical record medium, a hologram optical element having a first hologram for diffracting the laser beam onto a first pair of photodetectors to derive a focusing error and a second hologram for diffracting the laser beam onto a second pair of photodetectors to derive a tracking error. Each of the photodetectors of the second pair has light receiving regions which are divided along a division line substantially parallel with a diffracting direction of the second hologram which introduces astigmatism into the diffracted beams. A large tracking error signal can be detected stably on the basis of a distribution of an amount of light in a far field by the push-pull method.

4 Claims, 6 Drawing Sheets

FIG_7
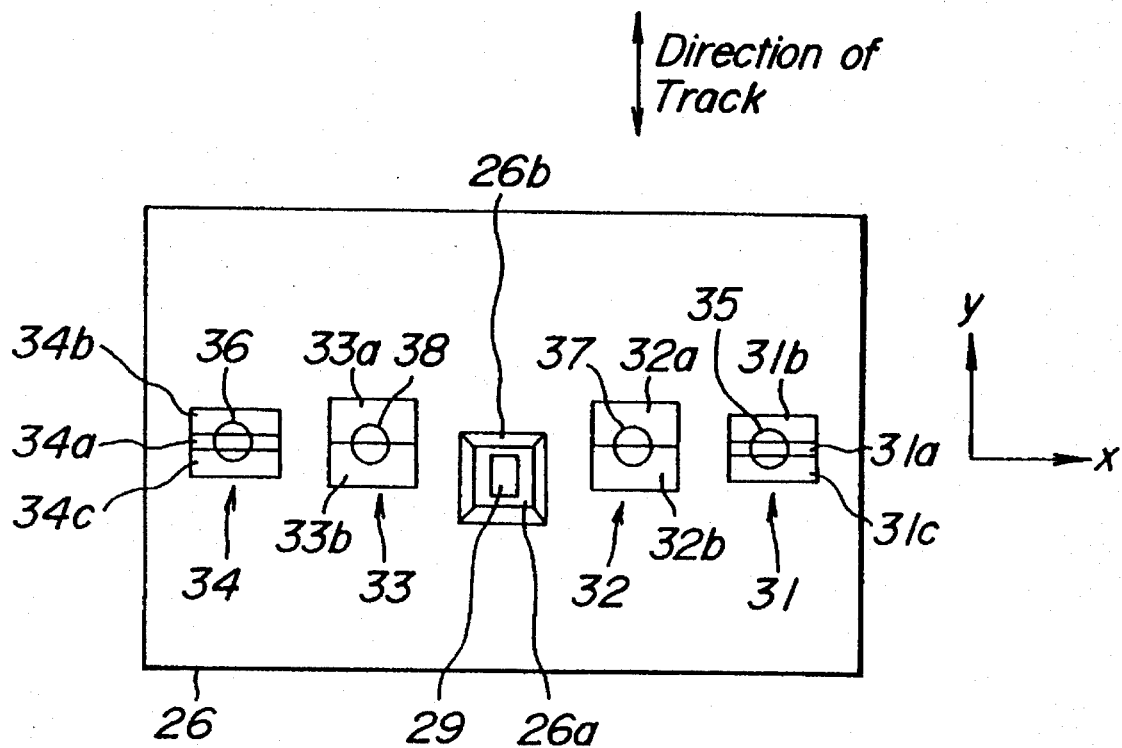
FIG_8
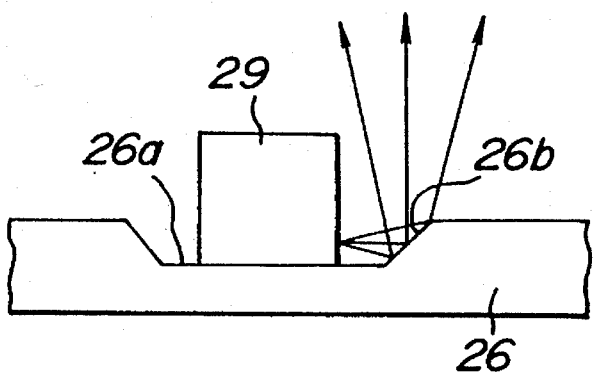

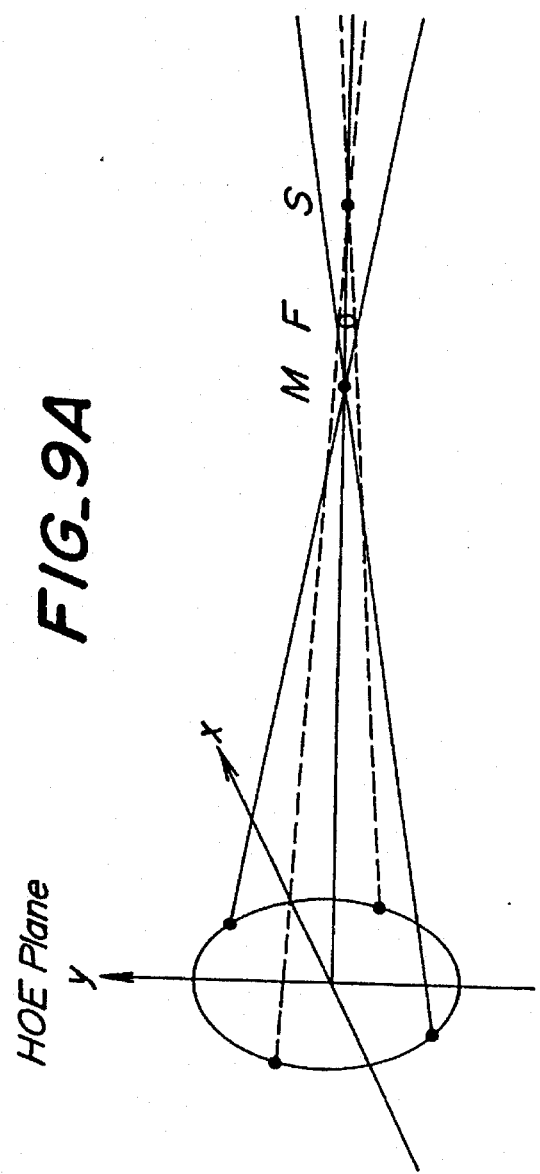
FIG._9A
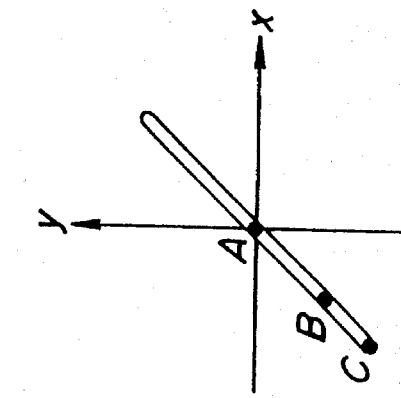
FIG._9E
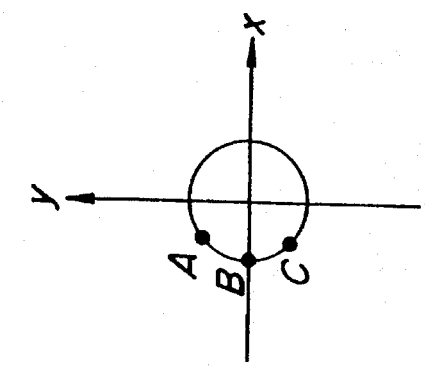
FIG._9D
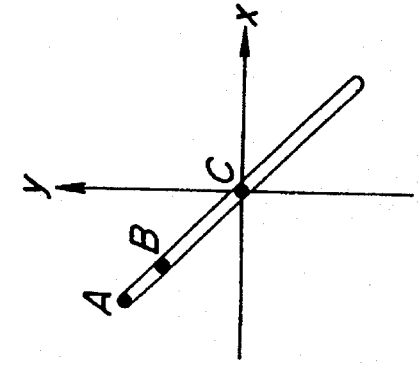
FIG._9C
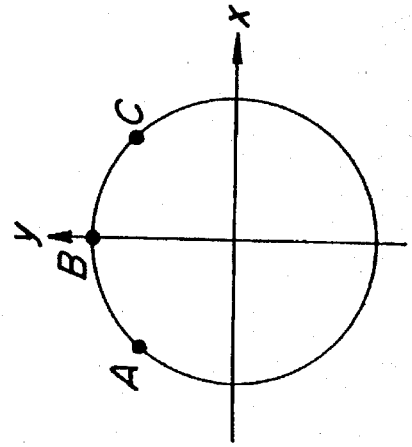
FIG._9B

FIG_10
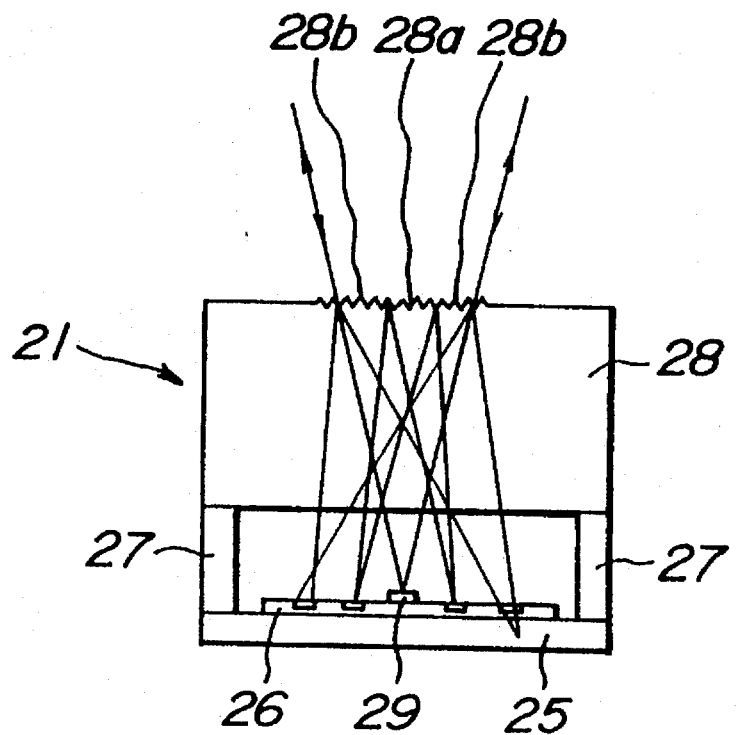
FIG_11
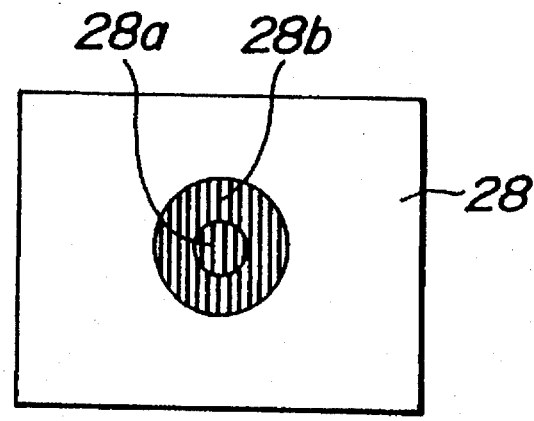

OPTICAL PICK-UP APPARATUS WITH TRACKING ERROR DETECTION BY DETECTION OF AMOUNT OF LIGHT IN FAN FIELD

BACKGROUND OF THE INVENTION

1. Field of the Invention

The present invention relates to an optical pick-up apparatus comprising a semiconductor laser emitting a laser beam, a converging optical system for projecting the laser beam emitted by the semiconductor laser onto an optical record medium as a fine spot, a hologram means for diffracting the laser beam reflected by said optical record medium to produce at least +1-order and −1-order beams, and a photodetector means for receiving said +1-order and −1-order beams diffracted by said hologram means to produce a tracking error signal.

2. Related Art Statements

An optical pick-up apparatus of the kind mentioned above has been described in Japanese Patent Application Laid-open Publication Kokai Hei 4-248134 published on Sep. 3, 1992. Further, the inventor of the instant application has proposed, in a Japanese Patent Application Laid-open Publication Kokai Hei 5-307759 published on Nov. 19, 1993 which is later than a priority date of the present application, an optical pick-up apparatus, in which a single main beam and two sub-beams are projected onto an optical record medium, a focusing error is detected from the main beam reflected by the optical record medium and a tracking error is detected from the two sub-beams. Such a tracking error detecting system has been usually called a three beam method.

FIGS. 1 to 4 illustrate the optical pick-up apparatus described in the above Laid-open Publication Kokai Hei 5-307759. As shown in FIG. 1, a semiconductor laser, photodetector and hologram are formed as a single unit 1. A laser beam emanating from the unit 1 is made incident upon an optical record medium 4 such as optomagnetic record medium or phase-change type record medium by means of a stop 2 and an objective lens 3. The laser beam reflected by the record medium 4, i.e. a return laser beam is made incident upon the unit 1 by means of the objective lens 3 and stop 2.

FIG. 2 shows a detailed construction of the unit 1. The unit comprises a base plate 5 on which a semiconductor substrate 6 is provided. Above the base plate 5 there is arranged a hologram optical element (HOE) 8 via a spacer 7. On the semiconductor substrate 6, there are mounted a semiconductor laser 9 and photodetectors 11, 12, 13 and 14, 15, 16 as depicted in FIG. 3. The three photodetectors 11, 12 and 13 are arranged on one side of the semiconductor laser 9 viewed in a direction x, and three photodetectors 14, 15 and 16 are arranged on the other side of the semiconductor laser 9. The photodetectors 11, 12 and 13 are aligned in a direction y perpendicular to the direction x, and similarly, the photodetectors 14, 15 and 16 are aligned in the direction y. As shown in FIG. 4, the semiconductor laser 9 is arranged on a bottom of a depression 6a formed in the surface of the semiconductor substrate 6 by etching, and the laser beam emitted by the semiconductor laser is reflected by an inclined side wall 6b of the depression. That is to say, the laser beam emitted by the semiconductor laser 9 in a direction parallel to the surface of the semiconductor substrate 6 is reflected by the side wall 6b in a direction perpendicular to the surface of the semiconductor substrate.

On a surface of the HOE 8 facing with the semiconductor substrate 6 there are provided gratings 8a which divide the laser beam emitted by the semiconductor laser 9 into three beams, i.e. 0-order beam, +1-order beam and −1-order beam. On an opposite surface of the HOE 8 there is formed a hologram pattern 8b which gives the +1-order beam and −1-order beam opposite powers.

The laser beam emitted by the semiconductor laser 9 is reflected by the mirror surface 6b and then is diffracted by the gratings 8a into the 0-order beam, +1-order beam and −1-order beam. The 0-order beam is utilized as a main beam and +1-order and −1-order beam are used as sub-beams. These three beams are made incident upon the optical record medium 4 such that the 0-order main beam is projected onto a center of an information track on the optical record medium, the +1-order beam is made incident upon one of edges of said track and the −1-order beam is made incident upon the other edge of said track. The three beams are reflected by the optical record medium and are made incident upon the hologram pattern 8b. Then, each of the three beams is diffracted by the hologram pattern 8b, and +1-order and −1-order beams of the main beam are made incident upon the photodetectors 12 and 15, +1-order and −1-order beams of one of the two sub-beams are made incident upon the photodetectors 11 and 14 and +1-order and −1-order beams of the other sub-beam are made incident upon the photodetectors 13 and 16.

In the optical pick-up apparatus shown in FIGS. 1 to 4, the hologram pattern 8b is constructed to give the ±1-order beams opposite powers to each other, so that it is possible to detect the focusing error from output signals of the photodetectors 12 and 15 by the beam size method. The tracking error is detected from output signals of the photodetectors 14 and 16 by the three beam method.

The above mentioned optical pick-up apparatus can be small in size and a reliability can be improved owing to the fact that the semiconductor laser 9, photodetectors 11–16 and hologram optical element 8 are formed as the single unit 1. However, various experiments and studies have revealed that the above mentioned optical pick-up apparatus has the following drawbacks. When a phase-change type record medium is used as the optical record medium, a ratio of intensity of the two sub-beams to be used for deriving the tracking error is not constant due to a fact that the reflectance of the phase-change type record medium changes locally or partly, so that it is impossible to obtain a stable tracking error signal. Furthermore, when use is made of a magneto-optical record medium as the optical record medium, a groove formed in the magneto-optical record medium has generally a depth of $\lambda/8$ ($\lambda$ is a wavelength of the laser beam), and thus it is impossible to attain a large tracking error signal by the three beam method.

SUMMARY OF THE INVENTION

The present invention has for its object to provide a novel and useful optical pick-up apparatus which can provide a large tracking error signal in a stable manner even if the optical record medium is constituted by the phase-change type record medium or magneto-optical record medium.

According to the invention, an optical pick-up apparatus comprises:

a semiconductor laser emitting a laser beam;

a converging optical system projecting the laser beam emitted by said semiconductor laser onto an optical record medium as a fine spot;

a hologram means for diffracting the laser beam reflected by said optical record medium in a given diffracting direction to produce at least one diffracted beam, said hologram means being constructed to introduce astigmatism in said diffracted beam; and a photodetecting means for receiving said diffracted beam emanating from said hologram means to produce a tracking error signal, said photodetecting means including a plurality of light receiving regions which are divided by a division line substantially parallel with the diffracting direction of said hologram means, said tracking error signal being detected on the basis of a distribution of amount of light in a far field.

In the optical pick-up apparatus according to the invention, the tracking error signal can be derived by using the single laser beam, so that it is possible to obtain the large tracking error signal in a stable manner even if the optical record medium is formed by the magneto-optical record medium or phase-change type optical record medium.

In a preferable embodiment of the optical pick-up according to the invention, the hologram means is constructed to produce ±1-order beams in the diffracting direction which is perpendicular to a track direction in which an information track extends and to give the ±1-order beams astigmatisms having mutually orthogonal directions which are inclined by ±45° with respect to the track direction. In this embodiment of the optical pick-up apparatus, any error in the tracking error signal does not occur even when a wavelength of the laser beam deviates, because a deviation in the distribution of an amount of light due to the variation of the wavelength appears in the division line.

BRIEF DESCRIPTION OF THE DRAWINGS

FIG. 7 is a plan view illustrating a semiconductor substrate of the unit;

FIG. 8 is a schematic cross sectional view showing the arrangement of a laser on the semiconductor substrate;

FIGS. 9A to 9E are schematic views representing the operation of the optical pick-up apparatus shown in FIG. 5;

FIG. 10 is a schematic cross sectional view depicting a unit of a second embodiment of the optical pick-up apparatus according to the invention; and FIG. 11 is a plan view of the unit illustrated in FIG. 9.

DESCRIPTION OF THE PREFERRED EMBODIMENT

Figure 5:
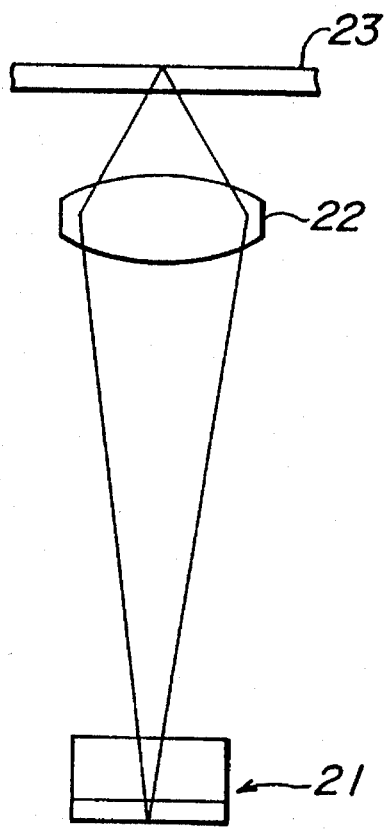
FIG. 5 is a schematic view depicting a first embodiment of the optical pick-up apparatus according to the invention.

FIG. 5 is a schematic view showing a first embodiment of the optical pick-up apparatus according to the invention. In the present embodiment, a semiconductor laser, photodetectors and holograms are formed as a single unit 21. A laser beam emanating from the unit 21 is made incident upon an optical record medium 23 as a fine spot by means of an objective lens 22. The laser beam reflected by the optical record medium 23 is made incident upon the unit 21 by means of the objective lens 22.

Figure 6:
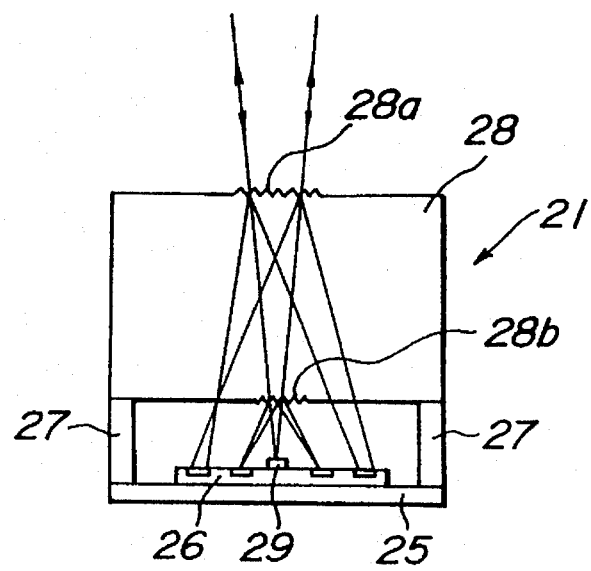
FIG. 6 is a cross sectional view showing a unit of FIG. 5.

FIG. 6 is a schematic cross sectional view illustrating a detailed construction of the unit 21 of the present embodiment. The unit 21 comprises a base plate 25, a semiconductor substrate 26 arranged on a surface of the base plate 25, and a hologram optical element HOE 28 provided above the semiconductor substrate 26 via a spacer 27. As shown in FIGS. 7 and 8, on the semiconductor substrate 26 there are arranged a semiconductor laser 29 emitting a laser beam having a given wavelength and a plurality of photodetectors 31, 32, 33 and 34. The photodetectors 31 and 32 are arranged on one side of the semiconductor laser 29 viewed in a direction x which is perpendicular to a direction y in which an information track on the optical record medium 22 extends, and the photodetectors 33 and 34 are provided on the other side of the semiconductor laser 29. The photodetector 31 includes three light receiving regions 31a, 31b and 31c which are divided in the direction y, and the photodetector 32 comprises two light receiving regions 32a and 32b also divided in the direction y. Similarly, the photodetector 33 includes two light receiving regions 33a and 33b which are divided in the direction y, and the photodetector 34 includes three light receiving elements 34a, 34b and 34c which are also divided in the direction y. It should be noted that the light receiving regions of the photodetectors are divided along division lines which extend in the direction x.

As best shown in FIG. 8, the semiconductor laser 29 is arranged on a depression 26a formed in the surface of the semiconductor substrate 26. A laser beam emitted by the semiconductor laser 29 in a direction parallel with the surface of semiconductor substrate 26 is reflected by an inclined side wall 26b of the depression 26a in a direction perpendicular to the surface of semiconductor substrate.

As shown in FIG. 6, the hologram optical element HOE 28 has formed therein a first hologram 28a in a surface opposing to the objective lens 22 and a second hologram 28b in a surface opposing to the semiconductor substrate 26. The first hologram 28a diffracts the laser beam reflected by the optical record medium 23 and gives positive and negative powers to +1-order diffracted beam and -1-order diffracted beam, respectively. The second hologram 28b diffracts a 0-order beam emanating from the first hologram 28a and gives +1-order and -1-order diffracted beams astigmatisms in mutually orthogonal directions. That is to say, the astigmatisms introduced in the +1-order and -1-order diffracted beams provide focus lines which are inclined by ±45° with respect to the track direction y in FIG. 7.

The +1-order and -1-order diffracted beams emanating from the first hologram 28a are made incident upon the photodetectors 31 and 34, respectively, and the +1-order and -1-order diffracted beams emanating from the second hologram 28b are made incident upon the photodetectors 32 and 33, respectively.

The laser beam emitted by the semiconductor laser 29 is reflected by the mirror surface 26b, is transmitted through the first and second holograms 28a and 28b, and then is projected onto the optical record medium 23 by means of the objective lens 22. The return laser beam reflected by the optical record medium 23 is diffracted by the first hologram 28a, and the +1-order and -1-order beams emanating from the first hologram 28a are received by the photodetectors 31 and 34, respectively. As stated above, the first hologram 28a is constructed to give these diffracted beams the opposite powers, so that the +1-order and -1-order beams are focused at points which situate before and after the surface of the semiconductor substrate 26. Therefore, sizes of a spot 35 formed on the photodetector 31 and a spot 36 formed on the photodetector 34 change in an opposite directions in accordance with defocused condition. When a focusing error is not existent, the sizes of these spots 35 and 36 become identical with each other, and in defocused condition, the sizes of these spots are changed in opposite directions in accordance with a direction of the defocusing.

Now it is assumed that output signals of the light receiving regions 31a, 31b and 31c are denoted by A1, A2 and A3, respectively and those of the light receiving regions 34a, 34b and 34c are expressed by A4, A5 and A6, respectively. Then, the focusing error signal FES may be obtained as follows.

$$FES=(A1+A5+A6)-(A2+A3+A4) \quad (1)$$

The 0-order beam emanating from the first hologram 28a is made incident upon the second hologram 28b and is diffracted thereby to produce +1-order and −1-order beams which are made incident upon the photodetectors 32 and 33, respectively as beam spots 37 and 38. As stated above, the second hologram 28b gives these diffracted beams the astigmatism having mutually orthogonal directions which are inclined by ±45° with respect to the track direction y, and thus light rays on a plane of this second hologram 28b are focused as illustrated in FIG. 9A. FIG. 9B illustrates position of three light rays A, B and C on a plane of the second hologram 28b. FIG. 9C represents projections of these light rays on a Meridional plane M, FIG. 9D show a projection on the focal plane, i.e. the plane of the photodetectors and FIG. 9E denotes projections of the light rays A, B and C on the Sagittal plane S.

When there is produced a tracking error, on a pupil of the second hologram 28b, there is produced a deviation in a distribution of an amount of light in the direction x. That is to say, the distribution of an amount of light deviates in the direction x which is perpendicular to the track direction y. Then, on the plane of the photodetectors 32 and 33, the deviation in the distribution of an amount of light in the direction x is transferred into that in the track direction y due to the directions of the astigmatisms introduced by the second hologram 28b. As stated above, the directions of the astigmatisms introduced in the +1-order and −1-order beams by the hologram 28b are deviated by 90°, so that the deviation in the distribution of an amount of light due to the track deviation on the plane of the photodetector 32 and that on the plane of the photodetector 33 differ from each other by 180°. Now it is assumed that output signals from light receiving regions 32a and 32b of the photodetector 32 are denoted by B1 and B2, respectively and those from the light receiving regions 33a and 33b of the photodetector 33 are represented by B3 and B4, respectively. Then, a tracking error signal TES may be derived by the following equation (2) in accordance with the push-pull method on the basis of the distribution of an amount of light in a far field.

$$TES=(B1+B4)-(B2+B3) \quad (2)$$

In the present embodiment, the astigmatism is introduced by the hologram optical element HOE 28 and the tracking error signal is detected on the basis of the change in the distribution of an amount of light in the far field of the diffracted beam. Therefore, even if the optical record medium 23 is formed by the phase-change type record medium whose reflectance is changed locally or the magneto-optical record medium with the groove having a depth of λ/8, it is possible to obtain the focusing error signal in a stable manner. Furthermore, a dividing line of the photodetectors 31 to 34 is coincided with the diffracting direction of the first and second holograms 28a and 28b, and thus when a diffraction angle deviates due to a variation in a wavelength of the laser beam, the centers of the spots on the photodetectors do not deviate from the dividing line. Therefore, any possible off-set of the tracking error signal and focusing error signal due to the variation in the wavelength can be effectively prevented. Moreover, when the beam spot on the optical record medium 23 moves to cross a track, the distribution in amount of light of the spots 35 and 36 on the photodetectors 31 and 34 deviates in the direction x in FIG. 7. However, the direction x of this deviation coincides with the dividing direction of the photodetectors 31 and 34, so that it is possible to prevent any off-set of the focusing error signal due to the track crossing. In this manner, the tracking error signal and focusing error signal can be obtained stably.

Figure 1:
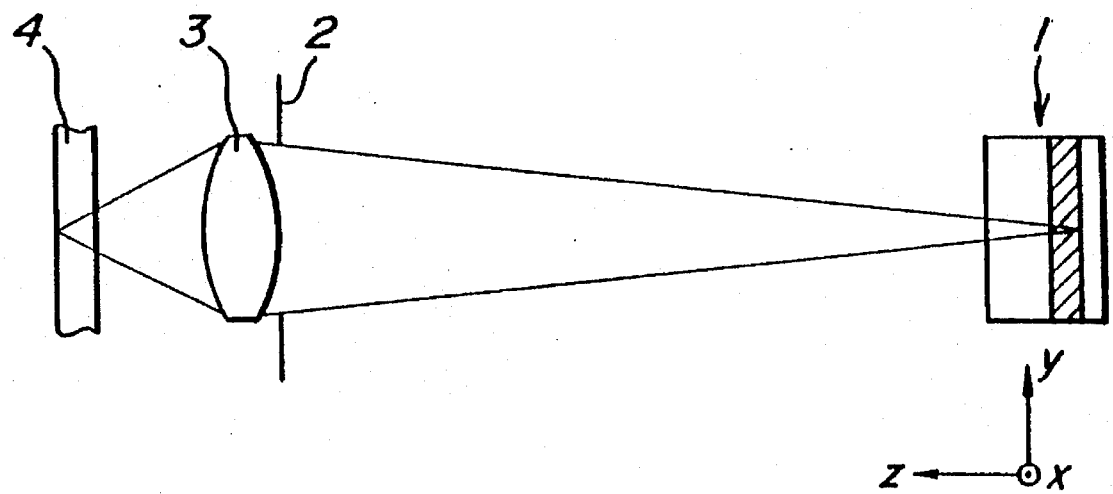
FIG. 1 is a schematic view showing an optical pick-up apparatus developed by the inventor.
Figure 2:
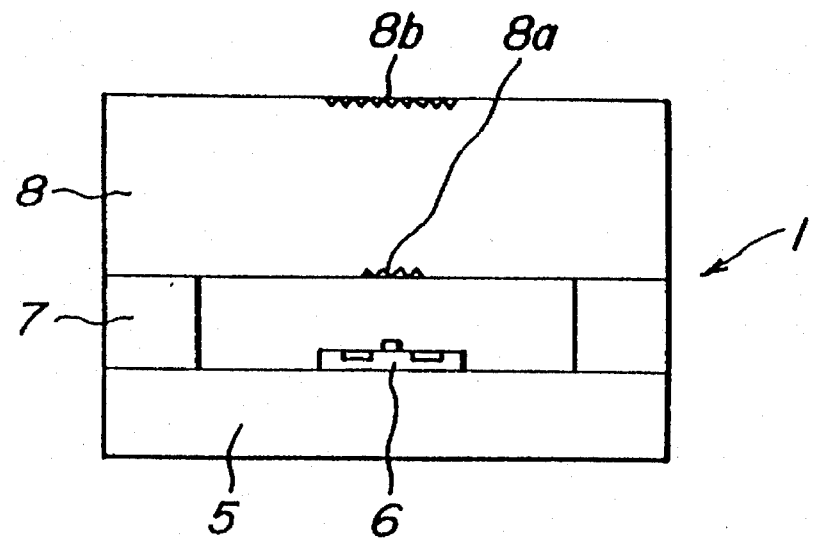
FIG. 2 is a cross sectional view illustrating the detailed construction of the unit shown in FIG. 1.
Figure 3:
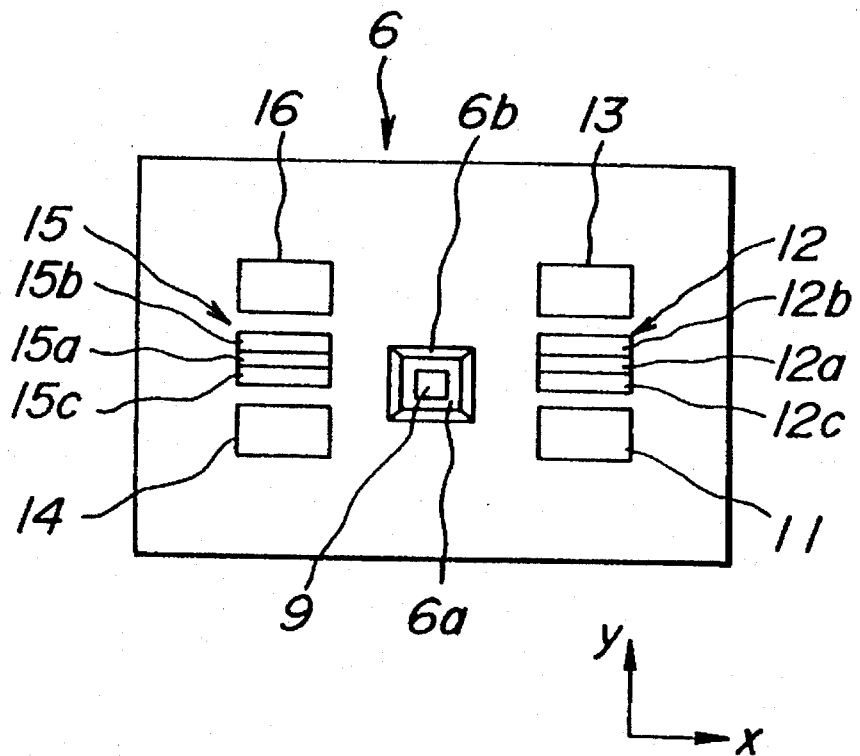
FIG. 3 is a plan view of the semiconductor substrate.
Figure 4:
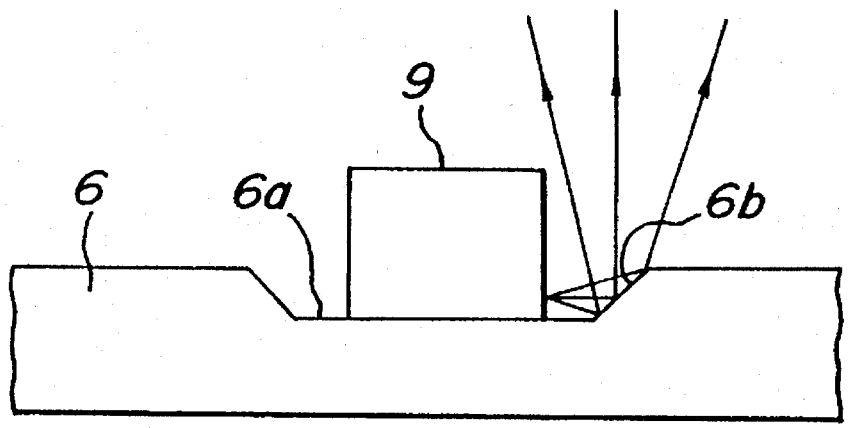
FIG. 4 is a cross sectional view representing a construction of the laser light source.

Further, in the present embodiment, the semiconductor laser 29, photodetectors 31 to 34 and hologram optical element 28 are formed as a single unit, so that the whole apparatus can be constructed small in size and the reliability of the apparatus can be improved. Moreover, an outer dimension of the unit and a thickness of the HOE may be made identical with those of the apparatus shown in FIG. 2, a some parts such as spacer may be commonly utilized in both apparatuses. FIG. 10 is a schematic cross sectional view showing a unit of a second embodiment of the optical pick-up apparatus according to the invention. In the present embodiment, the first hologram 28a and second hologram 28b are formed on the same surface of the hologram optical element 28. As illustrated in FIG. 11, the first hologram 28a is formed as a circular shape and the second hologram 28b is formed as a ring shape which surrounds the circular first hologram. The remaining construction of the second embodiment is entirely identical with that of the first embodiment.

In the present embodiment, the laser beam reflected by the optical record medium 23 is diffracted by the first and second holograms 28a and 28b simultaneously, and +1-order and −1-order beams diffracted by the first hologram 28a are made incident upon the photodetectors 31 and 34, respectively, and +1-order and −1-order beams diffracted by the second hologram 28b are made incident upon the photodetectors 32 and 33, respectively. Therefore, the focusing error signal and tracking error signal can be derived by processing the output signals of these photodetectors in the same manner as the first embodiment.

The present embodiment can provide the same advantages as those of the first embodiment, and in addition thereto the hologram optical element 28 can be less expensive due to the fact that both the first and second holograms 28a and 28b are formed on the same surface of the hologram optical element.

The present invention is not limited to the embodiments explained above, but many alternations and modifications may be conceived by those skilled in the art within the scope of the invention. For instance, in the above embodiments, the second hologram is constructed to introduce the mutually orthogonal astigmatisms in the +1-order and −1-order beams diffracted by the second hologram, but according to the invention, it is also possible to introduce the astigmatisms which are shifted by an angle other than 90° at a scarification of a small decrease in faculty. For instance, the astigmatisms may be shifted by 80°. Moreover, the focusing error signal may be detected not only by the beam size method, but by the knife-edge method and Foucault method. Furthermore, it is not always necessary to construct the semiconductor laser, photodetectors and hologram optical element as a single unit, but they may be constructed separately.

As explained above in detail, according to the present invention, each of the photodetectors for detecting the tracking error is divided along the division line which extends in parallel with the diffracting direction of the hologram, the hologram is constructed to introduce astigmatism in the diffracted beams, and the tracking error signal is derived from the distribution of an amount of light in a far field, and therefore it is possible to obtain the large tracking error signal in a stable manner without being affected by a change in a diffraction angle due to a variation in a wavelength of the laser beam although the optical record medium is constructed by magneto-optical record medium with a groove having a depth of $\lambda/8$ or phase-change type optical record medium having a locally different reflection.

What is claimed is:

1. An optical pick-up apparatus comprising:

a semiconductor laser for emitting a laser beam;

a converging optical system projecting the laser beam emitted by said semiconductor laser onto an optical record medium as a spot;

a hologram means including a first hologram for diffracting a return laser beam reflected by said optical record medium in a diffracting direction to produce at least one diffracted beam, said hologram means being constructed to give said diffracted beam astigmatism; and a photodetecting means for receiving said diffracted beam emanating from said hologram means to detect a tracking error signal, said photodetecting means including a plurality of light receiving regions which are divided by a division line substantially parallel with the diffracting direction of said hologram means, said tracking error signal being detected on the basis of a distribution of an amount of light in a far field; wherein said photodetecting means further comprises third and fourth photodetectors, and said hologram means further comprises a second hologram for diffracting the laser beam reflected by the optical record medium to produce ±1-order diffracted beams directed to said third and fourth photodetectors and 0-order beam directed to said first hologram, whereby a focusing error signal is derived by processing output signals from said third and fourth photodetectors.

2. An apparatus according to claim 1, wherein said semiconductor laser, photodetecting means and hologram means are formed as a single unit.

3. An apparatus according to claim 2, wherein said first and second holograms are provided on opposite surfaces of a hologram optical element.

4. An apparatus according to claim 2, wherein said first and second holograms are provided on a surface of a hologram optical element in a concentric manner.

* * * * *